United States Patent

Wu et al.

[11] Patent Number: 6,037,275
[45] Date of Patent: Mar. 14, 2000

[54] NANOPOROUS SILICA VIA COMBINED STREAM DEPOSITION

[75] Inventors: Hui-Jung Wu; James S. Drage, both of Fremont, Calif.; Lisa Beth Brungardt, Albuquerque, N.Mex.; Teresa Ramos, Albuquerque, N.Mex.; Douglas M. Smith, Albuquerque, N.Mex.

[73] Assignee: AlliedSignal Inc., Morristown, N.J.

[21] Appl. No.: 09/140,855

[22] Filed: Aug. 27, 1998

[51] Int. Cl.⁷ .................................................... H01L 21/316
[52] U.S. Cl. ............................ 438/780; 438/781; 438/782; 438/790; 427/245; 427/246
[58] Field of Search ........................... 438/622, 623, 438/624, 782, 790, 780, 781; 427/245, 246

[56] References Cited

U.S. PATENT DOCUMENTS

| 4,510,176 | 4/1985 | Cuthbert | 427/273 |
|---|---|---|---|
| 5,001,084 | 3/1991 | Kawai | 437/231 |
| 5,094,884 | 3/1992 | Hillman | 427/240 |
| 5,315,724 | 5/1994 | Tsukune | 427/489 |
| 5,646,071 | 7/1997 | Lin | 437/228 |
| 5,658,615 | 8/1997 | Hasebe | 427/240 |
| 5,753,305 | 5/1998 | Smith | 427/335 |
| 5,817,582 | 10/1998 | Maniar | 438/782 |

FOREIGN PATENT DOCUMENTS 0775669  5/1997  European Pat. Off. .

Primary Examiner—Charles Bowers
Assistant Examiner—Matthew Whipple
Attorney, Agent, or Firm—Leslie A. Weise

[57] ABSTRACT

A process for forming a nanoporous dielectric coating on a substrate. The process includes either (i) combining a stream of an alkoxysilane composition with a stream of a base containing catalyst composition to form a combined composition stream; immediately depositing the combined composition stream onto a surface of a substrate and exposing the combined composition to water (in either order or simultaneously); and curing the combined composition; or (ii) combining a stream of an alkoxysilane composition with a stream of water to form a combined composition stream; immediately depositing the combined composition stream onto a surface of a substrate; and curing the combined composition.

24 Claims, 4 Drawing Sheets

NANOPOROUS SILICA VIA COMBINED STREAM DEPOSITION

BACKGROUND OF THE INVENTION

1. Field of the Invention

The present invention relates to integrated circuits. More particularly, it relates to a method for producing nanoporous dielectric coatings useful in the production of integrated circuits.

2. Description of the Prior Art

In the production of integrated circuits, the problems of interconnect RC delay, power consumption and crosstalk become more significant as feature sizes approach 0.25 μm and below. It has been found that the use of low dielectric constant (K) materials for interlevel dielectric and intermetal dielectric applications partially mitigate these problems. However, each of the material candidates which are under consideration by the industry, having dielectric constants significantly lower than the currently employed dense silica, suffer from disadvantages. Most low dielectric constant materials developments use spin-on-glasses and fluorinated plasma chemical vapor disposition $SiO_2$ with K of >3. Some organic and inorganic polymers have dielectric constants in the range of about 2.2 to 3.5, however, these have the problems of low thermal stability, poor mechanical properties including low glass transition temperature, sample outgassing, and long term reliability questions.

One solution is the use of nanoporous silica, which can have dielectric constants in the range of about 1 to 3. Nanoporous silica is particularly attractive due to the ability to carefully control its pore size and pore distribution, and because it employs similar precursors such as tetraethoxysilane (TEOS), as is presently used for spin-on glass (SOG's), and CVD $SiO_2$. In addition to having low dielectric constants, nanoporous silica offers other advantages for microelectronics, including thermal stability up to 900° C.; small pore size (<<microelectronics features); use of materials, namely silica and its precursors, that are widely used in the semiconductor industry; the ability to tune dielectric constant over a wide range; and deposition using similar tools as employed for conventional spin-on glass processing. EP patent application EP 0 775 669 A2, which is incorporated herein by reference, shows a method for producing a nanoporous silica film with uniform density throughout the film thickness.

A key parameter controlling property of importance for nanoporous silica dielectrics is porosity, the inverse of density. Higher porosity materials not only lead to a lower dielectric constant than dense materials, but they also allow additional components and processing steps to be introduced. As density decreases, dielectric constant and mechanical strength decrease but the pore size increases. Important issues relating to porous materials include pore size; the strength decrease associated with porosity; and the role of surface chemistry on dielectric constant, loss and environmental stability.

Nanoporous silica films are typically produced on substrates by methods such as dip-coating or spin-coating. One known process of silica deposition is a pre-mix method whereby a pre-mixed composition containing a silica precursor composition, including water and/or a base, and an organic solvent is deposited on a spinning substrate to thereby uniformly coat the substrate. One disadvantage of this pre-mix method is that the solvent and the silica precursor composition begin to react with each other immediately upon contact. Once this reaction starts, it cannot be stopped. The liquid properties of the mixture, such as viscosity, keep changing as the reaction continues. These property changes can result in clumping, etc, which contributes to the formation of a non-uniform film on the substrate. In another known process for silica deposition, a silica precursor composition is deposited onto a substrate and post-mixed with water and/or a base catalyst in vapor form. Such a method can lead to uniformity problems. Clearly, a method is needed for coating a nanoporous silica film onto a substrate which would minimize thickness variance and maximize film uniformity.

The present invention offers a solution to this problem. It has been unexpectedly found that the deposition of a combined composition stream of an alkoxysilane composition plus water or a base catalyst or both water and a base catalyst onto a surface of a substrate immediately after their combining results in a more uniform film. Alternatively, the alkoxysilane composition and optional base containing catalyst composition can form a combined composition stream which is exposed to water, such as water vapor, to produce a film. Using the combined stream method, the components of the combined composition stream first contact each other in the space above the substrate such that the combined stream is unbounded at the point of confluence of the individual streams. This minimizes reaction time between the components prior to deposition, which allows for better control of film properties such as film thickness, pore size, dielectric constant, etc. After exposure to water, the combined composition stream of this invention forms a gel which is then cured, aged, or dried. Using this process, a nanoporous silica film with a more uniform density and film thickness is formed onto a substrate.

SUMMARY OF THE INVENTION

The present invention provides a process for forming a nanoporous dielectric coating on a substrate which comprises:

A) performing either (i) or (ii):
i) a) combining a stream of an alkoxysilane composition with a stream of a base containing catalyst composition to form a combined composition stream which is unbounded at a point of confluence; and conducting steps (b) and (c) in either order or simultaneously:
b) immediately depositing the combined composition stream onto a surface of a substrate;
c) exposing the combined composition to water; and
ii) a) combining a stream of an alkoxysilane composition with a stream of water to form a combined composition stream which is unbounded at a point of confluence; and
b) immediately depositing the combined composition stream onto a surface of a substrate; and
B) curing the combined composition.

The present invention further provides a semiconductor device produced by a process which comprises:

A) performing either (i) or (ii):
i) a) combining a stream of an alkoxysilane composition with a stream of a base containing catalyst composition to form a combined composition stream which is unbounded at a point of confluence; and conducting steps (b) and (c) in either order or simultaneously:
b) immediately depositing the combined composition stream onto a surface of a semiconductor substrate;
c) exposing the combined composition to water; and
ii) a) combining a stream of an alkoxysilane composition with a stream of water to form a combined composition stream which is unbounded at a point of confluence; and b) immediately depositing the combined composition stream onto a surface of a semiconductor substrate; and B) curing the combined composition.

DETAILED DESCRIPTION OF THE PREFERRED EMBODIMENT

According to the invention, an alkoxysilane precursor composition is formed from at least one alkoxysilane and a solvent composition. The alkoxysilane composition discharged onto a suitable substrate in the form of a stream. In one preferred embodiment, the stream of alkoxysilane composition is combined with a stream of water to form a combined composition stream immediately prior to discharge onto the substrate.

In another embodiment, a combined composition stream is formed from a stream of the alkoxysilane composition and a stream of a base containing catalyst composition. The combined composition stream is thereafter deposited onto a surface of a substrate. Exposure to a water vapor atmosphere hydrolyzes the precursor composition to form a gel layer. In another embodiment of the present invention, the combined composition stream is deposited onto the substrate and is then exposed to the water, in the form of a water vapor atmosphere. In another embodiment, the combined composition stream is exposed to the water before deposition onto the substrate. In still another embodiment of the invention, the combined composition stream is simultaneously exposed to the water and deposited onto the substrate. This may be in the form of a water stream or a water vapor atmosphere. After deposition and water exposure, the combined composition may be cured, aged, or dried to thereby form a nanoporous dielectric coating on the substrate.

The stream components of the combined stream composition contact each other in the space above the surface of the substrate, immediately prior to deposition. At a point of confluence of the individual streams, the combined stream is unbounded by tubing, piping, manifolds or the like. This minimizes reaction time between the components prior to deposition and prevents reaction within the intersection point of supply tubes.

FIGS. 1–4 show schematic representations of various apparatus which may be used for depositing combined streams of alkoxysilane, water and base compositions according to the present invention. While these figures show the use of syringe pumps, other devices may be used to combine the components of the combined composition stream. Such nonexclusively include faucets, sprayers, hoses, tanks, pipes, tubes, and the like. Various methods of combining the components may be used, such as dripping, squirting, streaming, spraying, and the like.

Figure 1:
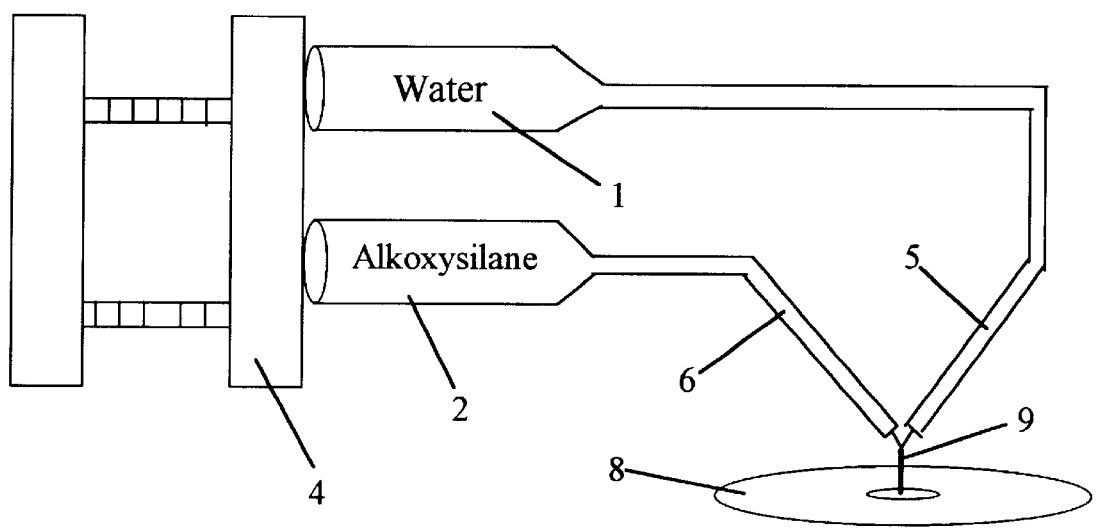
FIG. 1 shows schematic representation of a pumping apparatus having two separate tanks, each with a discharge tube for separately discharging an alkoxysilane composition and water, respectively.
Figure 2:
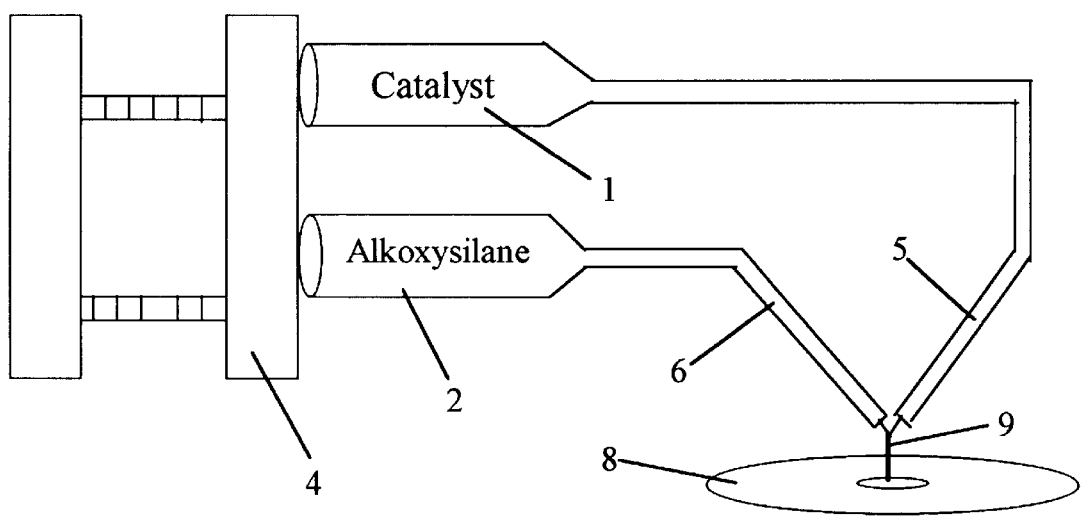
FIG. 2 shows a schematic representation of a pumping apparatus having two separate tanks, each with a discharge tube for separately discharging an alkoxysilane composition and a base containing catalyst composition, respectively.

In one embodiment of the invention, as shown in FIG. 1, a pumping apparatus 4 where two separate components of a combined composition stream 9 are held in separate tanks 1 and 2 respectively, until they are to be reacted with each other. Tanks 1 and 2 hold an alkoxysilane composition and water, and have separate discharge tubes 5 and 6 for discharging the alkoxysilane composition and water. The alkoxysilane composition and water are separately discharged from the apparatus 4 through the tubes 5 and 6 and are combined together to form a combined composition stream 9 which is deposited onto a surface of a substrate 8. In another embodiment, the pumping apparatus 4 contains an alkoxysilane composition and a base containing catalyst composition in separate tanks 1 and 2, as seen in FIG. 2.

Figure 3:
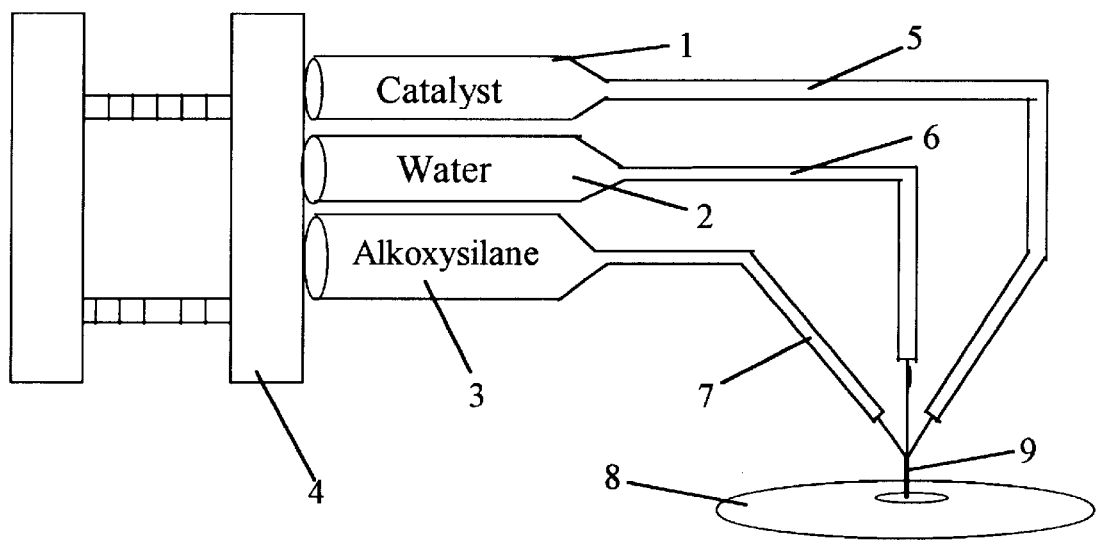
FIG. 3 shows a schematic representation of a pumping apparatus having three separate tanks, each with a discharge tube for separately discharging an alkoxysilane composition, a base containing catalyst composition, and water, respectively.

In another embodiment of the invention, a pumping apparatus 4 can have three separate tanks 1, 2, and 3, as shown in FIG. 3, each with a separate discharge tube 5, 6, and 7 for discharging an alkoxysilane composition, a base containing catalyst composition, and water, respectively.

Figure 4:
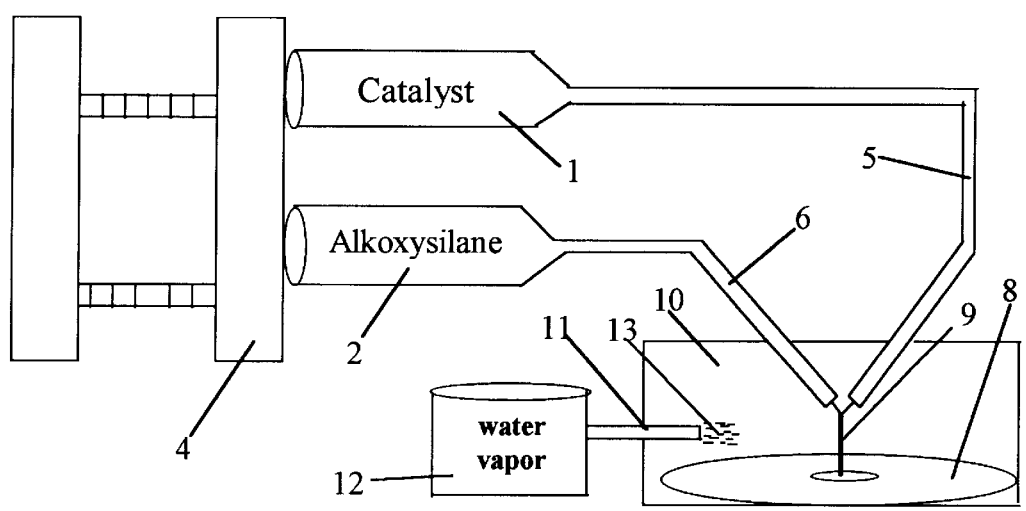
FIG. 4 shows a schematic representation of a pumping apparatus having two separate tanks, each with a discharge tube for separately discharging an alkoxysilane composition and a base containing catalyst composition. The apparatus has an enclosed substrate-containing box with a water vapor input.

FIG. 4 shows a pumping apparatus where a combined stream of alkoxysilane and base catalyst is deposited onto a substrate in a closed environment which holds a water vapor atmosphere. FIG. 4 shows a pumping apparatus 4 having two separate tanks 1 and 2 having separate discharge tubes 5 and 6 for discharging an alkoxysilane composition and a base containing catalyst composition, respectively. This apparatus also has a closed substrate containing vessel 10 with a water vapor input 11. According to this embodiment of the invention, water vapor 13 is pumped from a water reservoir tank 12 through the water vapor input 11 and is injected into the vessel 10. This exposes the combined composition stream 9 to water either during or after deposition onto a surface of a substrate 8.

Useful alkoxysilanes for this invention include those which have the formula:

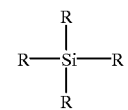

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

Preferably, the solvent composition for the alkoxysilane comprises a relatively high volatility solvent or a relatively low volatility solvent or both a relatively high volatility solvent and a relatively low volatility solvent. The solvent, usually the higher volatility solvent, is at least partially evaporated immediately after deposition onto the substrate.

This partial drying leads to better planarity due to the lower viscosity of the material after the first solvent or parts of the solvent comes off The more volatile solvent evaporates over a period of seconds or minutes. Slightly elevated temperatures may optionally be employed to accelerate this step. Such temperatures preferably range from about 20° C. to about 80° C., more preferably from about 20° C. to about 50° C. and most preferably from about 20° C. to about 35° C.

For purposes of this invention, a relatively high volatility solvent is one which evaporates at a temperature below, preferably significantly below, that of the relatively low volatility solvent. The relatively high volatility solvent preferably has a boiling point of about 120° C. or less, more preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

The relatively low volatility solvent composition is one which evaporates at a temperature above, preferably significantly above, that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The alkoxysilane component is preferably present in an amount of from about 3% to about 50% by weight of the overall blend, more preferably from about 5% to about 45% and most preferably from about 10% to about 40%.

The solvent component of the alkoxysilane precursor composition is preferably present in an amount of from about 20% to about 90% by weight of the overall blend, more preferably from about 30% to about 70% and most preferably from about 40% to about 60%. When both a high and a low volatility solvent are present, the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The base containing catalyst composition contains a base, or a base plus water, or a base plus an organic solvent, or a base plus both water and an organic solvent The base is present in a catalytic amount which can be readily determined by those skilled in the art. Preferably the molar ratio of base to silane ranges from about 0 to about 0.2, more preferably from about 0.001 to about 0.05, and most preferably from about 0.005 to about 0.02. Water is included to provide a medium for hydrolyzing the alkoxysilane. The mole ratio of waterto silane is preferably from about 0 to about 50, more preferably from about 0.1 to about 10 and a most preferably from about 0.5 to about 1.5. Suitable solvents for the base containing catalyst composition include those listed above as a high volatility solvent. Most preferred solvents are alcohols such as ethanol and isopropanol.

In the preferred embodiment, the temperature of the water during the exposure preferably ranges from about 10° C. to about 60° C., more preferably from about 15° C. to about 50° C., and most preferably from about 20° C. to about 40° C.

In the preferred embodiment, the temperature of the base during the exposure preferably ranges from about 10° C. to about 60° C., more preferably from about 15° C. to about 40° C., and most preferably from about 20° C. to about 30° C.

Suitable bases nonexclusively include ammonia and amines, such as primary, secondary and tertiary alkyl amines, aryl amines, alcohol amines and mixtures thereof which have a preferred boiling point of at least about −50° C., more preferably at least about 50° C., and most preferably at least about 150° C. Preferred amines are alcoholamines, alkylamines, methylamine, dimethylamine, trimethylamine, n-butylamine, n-propylamine, tetramethyl ammonium hydroxide, piperidine, 2-methoxyethylamine, mono-, di- or triethanolamines, and mono-, di-, or triisopropanolamines.

The ability of an amine to accept a proton in water is measured in terms of the basicity constant $K_b$, and $pK_b = -\log K_b$. In the preferred embodiment, the $pK_b$ of the base may range from about less than 0 to about 9, more preferably from about 2 to about 6 and most preferably from about 4 to about 5.

The combined composition may be cured, aged, or dried in a conventional way such as solvent evaporation of the less volatile solvent. Elevated temperatures may be employed to cure, age or dry the coating. Such temperatures preferably range from about 20° C. to about 450° C., more preferably from about 50° C. to about 350° C. and most preferably from about 175° C. to about 320° C. For purposes of the present invention, the term "curing" refers to the curing, aging, or drying of the combined composition onto the substrate after deposition and exposure to water.

As a result, a relatively high porosity, low dielectric constant silicon containing polymer composition is formed on the substrate. The silicon containing polymer composition preferably has a dielectric constant of from about 1.1 to about 3.5, more preferably from about 1.3 to about 3.0, and most preferably from about 1.5 to about 2.5. The pore size of silica composition preferably ranges from about 1 nm to about 100 nm, more preferably from about 2 nm to about 30 nm, and most preferably from about 3 nm to about 20 nm.

The density of the silicon containing composition, including the pores, preferably ranges from about 0.1 to about 1.9 g/cm$^2$, more preferably from about 0.25 to about 1.6 g/cm$^2$, and most preferably from about 0.4 to about 1.2 g/cm$^2$.

In an optional additional step, the nanoporous silica dielectric film on the substrate is reacted with an effective amount of a surface modification agent for a period of time sufficient for the surface modification agent to penetrate the pore structure and render it hydrophobic. The surface modification agent is hydrophobic and suitable for silylating silanol moieties on the hydrophilic pore surfaces. Preferably the surface modification agent is a compound having a formula selected from the group consisting of: $R_3SiNHSiR_3$, $R_xSiCl_y$, $R_xSi(OH)_y$, $R_3SiOSiR_3$, $R_xSi(OR)_y$, $M_pSi(OH)_{[4-p]}$, $R_xSi(OCOCH_3)_y$ and combinations thereof, wherein x is an integer ranging from 1 to 3, y is an integer ranging from 1 to 3 such that y=4−x, p is an integer ranging from 2 to 3; each R is an independently selected from hydrogen and a hydrophobic organic moiety; each M is an independently selected hydrophobic organic moiety; and R and M can be the same or different. The R and M groups are preferably independently selected from the group of organic moieties consisting of alkyl, aryl and combinations thereof. The alkyl moiety is substituted or unsubstituted and is selected from the group consisting of straight alkyl, branched alkyl, cyclic alkyl and combinations thereof, and wherein said alkyl moiety ranges in size from $C_1$ to about $C_{18}$. The aryl moiety is substituted or unsubstituted and ranges in size from $C_5$ to about $C_{18}$. Preferably the surface modification agent is selected from the group consisting of acetoxytrimethylsilane, acetoxysilane, diacetoxydimethylsilane, methyltriacetoxysilane, phenyltriacetoxysilane, diphenyldiacetoxysilane, trimethylethoxysilane, trimethylmethoxysilane, 2-trimethylsiloxypent-2-ene-4-one, n-(trimethylsilyl) acetamide, 2-(trimethylsilyl) acetic acid, n-(trimethylsilyl) imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol and combinations thereof. Most preferably the surface modification agent is hexamethyldisilazane. The surface modification agent may be mixed with a suitable solvent such as acetone, applied to the nanoporous silica surface in the form of a vapor or liquid, and then dried.

The following nonlimiting examples serve to illustrate the invention.

EXAMPLE 1

This example demonstrates that a catalyzed nanoporous silica precursor deposited via codeposition can be aged in ambient cleanroom humidity to yield low density uniform thin films.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was monoethanolamine. It was diluted 8.75% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The wafer was spun at 2500 rpm for 30 seconds after deposition. The film was placed in a wafer carrier cartridge in the cleanroom ambient humidity that was set at 35%. The film was aged for 15 min.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 1 lists the results of the experiment.

TABLE 1

| Characterization Results of 15 min Codeposition Film | |
|---|---|
| Thickness (Angstroms) | 10,000 |
| Refractive index | 1.158 |
| Hydrophobicity (contact angle) | >80° |

EXAMPLE 2

This example demonstrates that a catalyzed nanoporous silica precursor deposited via codeposition can be aged in a controlled water vapor chamber at 50% relative humidity to yield low density uniform thin films.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was monoethanolamine. It was diluted 91.25% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The wafer was spun at 2500 rpm for 30 seconds after deposition. The film was placed in a closed chamber with nitrogen flowing through water at 2 l/min. This flows through the chamber for a few seconds to get the humidity up to 50%. The film aged in this saturated environment for 15 minutes.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 2 lists the results of the experiment.

TABLE 2

Characterization Results of 15 min Codeposition Film

| | |
|---|---|
| Thickness (Angstroms) | 10,100 |
| Refractive index | 1.145 |
| Hydrophobicity (contact angle) | >80° |

EXAMPLE 3

This example demonstrates that a catalyzed nanoporous silica precursor deposited via codeposition can be aged in ambient cleanroom humidity to yield low density uniform thin films. In this example a residence time of 15 seconds after deposition and before spinning was put in place to allow for better mixing.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was monoethanolamine. It was diluted 91.25% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The precursor/catalyst mix was allowed to spread out across the wafer for 15 seconds before spinning at 2500 rpm for 30 seconds. The film was placed in a wafer carrier cartridge in the cleanroom ambient humidity that was set at 35%. The film was aged for 15 min.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 3 lists the results of the experiment.

TABLE 3

Characterization Results of 15 min Codeposition Film

| | |
|---|---|
| Thickness (Angstroms) | 11,100 |
| Refractive index | 1.15 |
| Hydrophobicity (contact angle) | >80° |

EXAMPLE 4

This example demonstrates that a catalyzed nanoporous silica precursor deposited via codeposition can be aged in ambient cleanroom humidity to yield low density uniform thin films. In this example a mixture of amines is used as the catalyst source.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was a 50/50 by weight mixture of triethylenepentamine and monoethanolamine. It was diluted 91.25% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The solution was allowed to spread across the wafer for 15 seconds before spinning at 2500 rpm for 30 seconds after deposition. The film was placed in a wafer carrier cartridge in the cleanroom ambient humidity that was set at 35%. The film was aged for 60 minutes.

The film was then solvent exchanged by depositing 20–30 mL of an aged (36 hrs) 50/50 (by vol.) mixture of Acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 4 lists the results of the experiment.

TABLE 4

Characterization Results of 60 min Codeposition Film

| | |
|---|---|
| Thickness (Angstroms) | 11,000 |
| Refractive index | 1.15 |
| Hydrophobicity (contact angle) | >80° |

EXAMPLE 5

This example demonstrates that a catalyzed nanoporous silica precursor deposited via codeposition can be aged in ambient cleanroom humidity to yield low density uniform thin films.

The precursor was synthesized by adding 94.18 mL of tetraethoxysilane, 61.0 mL of triethylene glycol monomethyl ether, 7.55 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 58% by weight with ethanol to reduce the viscosity. The catalyst used was monoethanolamine. It was diluted 92.0% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The solution was allowed to spread across the wafer for 30 seconds after deposition before spinning at 2500 rpm for 30 sec. The film was placed in a wafer carrier cartridge in the cleanroom ambient humidity that was set at 35%. The film was aged for 8 minutes.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The films were then spun dry at 1000 rpm for 5 seconds. The film was then heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 5 lists the results of the experiment.

TABLE 5

Characterization Results of 8 min Codeposition Film

| | |
|---|---|
| Thickness (Angstroms) | 7500 |
| Refractive index | 1.142 |
| Hydrophobicity (contact angle) | >80° |

EXAMPLE 6

This example demonstrates that a catalyzed nanoporous silica precursor dynamically deposited via codeposition can be aged in ambient cleanroom humidity to yield low density uniform thin films.

The precursor was synthesized by adding 94.18 mL of tetraethoxysilane, 61.0 mL of triethylene glycol monomethyl ether, 7.55 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 58% by weight with ethanol to reduce the viscosity. The catalyst used was monoethanolamine. It was diluted 92.0% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The wafer was spinning at 100 rpm during deposition, then at 2500 rpm for 30 sec. The film was placed in a wafer carrier cartridge in the cleanroom ambient humidity that was set at 35%. The film was aged for 8 minutes.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 6 lists the results of the experiment.

TABLE 6

Characterization Results of 8 min Codeposition Film

| | |
|---|---|
| Thickness (Angstroms) | 7500 |
| Refractive index | 1.140 |
| Hydrophobicity (contact angle) | >80° |

EXAMPLE 7

This example demonstrates that a catalyzed nanoporous silica precursor deposited via codeposition can be aged in ambient cleanroom humidity to yield low density uniform thin films. In this example triethylenepentamine is used as the catalyst source.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was triethylenepentamine and. It was diluted 8.75% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The solution was allowed to spread across the wafer for 15 seconds before spinning at 2500 rpm for 30 seconds after deposition. The film was placed in a wafer carrier cartridge in the cleanroom ambient humidity that was set at 42%. The film was aged for 60 minutes.

The film was then solvent exchanged by depositing 20–30 mL of an aged (36 hrs) 50/50 (by vol.) mixture of acetone and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 7 lists the results of the experiment.

TABLE 7

Characterization Results of 60 min Codeposition Film

| | |
|---|---|
| Thickness (Angstroms) | 10,500 |
| Refractive index | 1.11 |
| Hydrophobicity (contact angle) | >80° |

EXAMPLE 8

This example demonstrates that a catalyzed nanoporous silica precursor deposited via codeposition can be aged in ambient cleanroom humidity to yield low density uniform thin films. In this example was 2-(2-aminoethylamino) ethanol is used as the catalyst source.

The precursor was synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution was allowed to mix vigorously then heated to ~80° C. and refluxed for 1.5 hours to form a solution. After the solution was allowed to cool, it was diluted 21.6% by weight with ethanol to reduce the viscosity. The catalyst used was 2-(2-aminoethylamino)ethanol and. It was diluted 8.75% by weight in ethanol to reduce viscosity and increase the gel time.

A dual syringe pump as seen in FIG. 2 was used for deposition using 5 ml and 20 ml syringes. The precursor was in the larger syringe and catalyst in the smaller. 1 ml of precursor and 0.346 ml of catalyst were simultaneously deposited at a rate of 10 ml/min and met at a 90° angle to form one stream onto the substrate. The solution was allowed to spread across the wafer for 15 seconds before spinning at 2500 rpm for 30 seconds after deposition. The film was placed in a wafer carrier cartridge in the cleanroom ambient humidity that was set at 34%. The film was aged for 30 minutes.

The film was then solvent exchanged by depositing 20–30 mL of an aged (36 hrs) 50/50 (by vol.) mixture of acetone, and hexamethyldisilazane (HMDZ) for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. Table 8 lists the results of the experiment.

TABLE 8

Characterization Results of 30 min Codeposition Film

| | |
|---|---|
| Thickness (Angstroms) | 12,500 |
| Refractive index | 1.135 |
| Hydrophobicity (contact angle) | >80° |

EXAMPLE 9

This example demonstrates that a base water mixture can be co-deposited with a nanoporous silica precursor then aged in ambient cleanroom humidity to yield low density uniform thin films. An alkoxysilane precursor was synthesized by adding 150.0 mL of tetraethoxysilane, 75.0 mL of triethylene glycol monomethyl ether, 12.1 mL of deionized water, and 0.48 mL of 1N nitric acid together in a round bottom flask. The solution was allowed to mix vigorously then heated to ~80° C. and refluxed for 1.5 hours to form a solution. After the solution was allowed to cool, it was diluted 50.0% by weight with ethanol to reduce the viscosity. The catalyst used was monoethanolamine. It was diluted 8.3% by weight in deionized water. The monoethanolamine/water solution was then diluted 50% by weight in ethanol to reduce the viscosity.

A dual syringe pump as seen in FIG. 2 was used for deposition using 5 ml and 20 ml syringes. The precursor was in one syringe and catalyst in the other. 2.52 ml of precursor and 0.5 ml of the catalyst/water mixture were simultaneously deposited at a rate of 10 ml/min and met at a 90° angle to form one stream onto the substrate. The wafer was spun at 2500 rpm for 30 seconds after deposition. The wafer was then placed in an aging chamber where nitrogen was flowed through a water bubbler and into the chamber at a rate of 2 l/min. to produce a relative humidity of 75% within the chamber. The wafer was left in the chamber for 10 minutes. The film was then solvent exchanged by depositing 20–30 mL of an aged (36 hrs.) 50/50 (by vol.) mixture of acetone, and hexamethyldisilazane for 20 seconds at 250 rpm without allowing the film to dry. The film was then spun dry at 1000 rpm for 5 seconds. The film was heated at elevated temperatures for 1 min. each at 175° C. and 320° C. in air. The film was characterized by ellipsometry to determine the refractive index and thickness. In addition, the hydrophobicity was tested by placing a water drop onto the film to determine the contact angle. The film had a thickness of 9000 (Å) and a refractive index of 1.1.

EXAMPLE 10

This example demonstrates that water and a nanoporous silica precursor can be co-deposited then aged in ambient cleanroom humidity to yield low density uniform thin films.

A precursor is synthesized by adding 104.0 mL of tetraacetoxysilane, 47.0 mL of triethylene glycol monomethyl ether, 8.4 mL of deionized water, and 0.34 mL of 1N nitric acid together in a round bottom flask. The solution is allowed to mix vigorously then heated to ~80° C. and refluxed for 1.5 hours to form a solution. After the solution is allowed to cool, it is diluted 21.6% by weight with ethanol to reduce the viscosity. Deionized water is used to hydrolyze the acetoxy groups and form acetic acid to promote gelation. It is diluted 8% by weight in ethanol to reduce the viscosity.

A dual syringe pump as seen in FIG. 1 is used for deposition using 5 ml and 20 ml syringes. The precursor is in one syringe and water/ethanol mixture in the other. 1 ml of precursor and 0.346 ml of water/ethanol are simultaneously deposited at a rate of 10 ml/min and met at a 90° angle to form one stream onto the substrate. The wafer is spun at 2500 rpm for 30 seconds after deposition. The film is placed in a wafer carrier cartridge in the cleanroom ambient humidity that is set at 35%. The film is aged for 15 min.

The film is then solvent exchanged by depositing 20–30 mL of an aged (36 hrs.) 50/50 (by vol.) mixture of acetone, and hexamethyldisilazane for 20 seconds at 250 rpm without allowing the film to dry. The film is then spun dry at 1000 rpm for 5 seconds. The film is heated at elevated temperatures for 1 min. each at 175° C. and 320° C. in air. The film is characterized by ellipsometry to determine the refractive index and thickness. In addition, the hydrophobicity is tested by placing a water drop onto the film to determine the contact angle.

EXAMPLE 11

This example demonstrates that the individual components of water, catalyst and nanoporous silica can be codeposited simultaneously then aged to produce a low density thin film. A precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously then heated to ~80° C. and refluxed for 1.5 hours to form a solution. After the solution is allowed to cool, it is diluted 21.6% by weight with ethanol to reduce the viscosity.

The catalyst used is monoethanolamine. It is diluted 8.75% by weight in ethanol. Deionized water is also used. It is diluted 8.75% in ethanol also to reduce viscosity. A syringe pump as seen in FIG. 3 is used for deposition using 5 ml and 20 ml syringes. The precursor is in the larger syringe and catalyst and water in the smaller syringes. 1 ml of precursor, 0.346 ml of catalyst, and 0.173 ml of deionized water are simultaneously deposited at a rate of 10 ml/min and met at a 90° angle to form one stream onto the substrate. The wafer is spun at 2500 rpm for 30 seconds after deposition. The film is placed in a wafer carrier cartridge in the cleanroom ambient humidity that is set at 35%. The film is aged for 15 min. The film is then solvent exchanged by depositing 20–30 mL of a 50/50 (by vol.) mixture of acetone, and hexamethyldisilazane for 20 seconds at 250 rpm without allowing the film to dry. The film is then spun dry at 1000 rpm for 5 seconds. The film is heated at elevated temperatures for 1 min. each at 175° C. and 320° C. in air. The film is characterized by ellipsometry to determine the refractive index and thickness. In addition, the hydrophobicity is tested by placing a water drop onto the film to determine the contact angle.

EXAMPLE 12

This example demonstrates that a catalyzed nanoporous silica precursor deposited via codeposition can be aged in ambient cleanroom humidity to yield low density uniform thin films. A precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously then heated to ~80° C. and refluxed for 1.5 hours to form a solution. After the solution is allowed to cool, it is diluted 21.6% by weight with ethanol to reduce the viscosity.

The catalyst used is monoethanolamine. It is diluted 8.75% by weight in ethanol to reduce viscosity and increase the gel time. A dual syringe pump as seen in FIG. 2 is used for deposition using 5 ml and 20 ml syringes. The precursor is in the larger syringe and catalyst in the smaller. 1 ml of precursor and 0.346 ml of catalyst are simultaneously deposited at a rate of 10 ml/min in a closed chamber that has a water bubbler regulating the humidity to 50%. The streams meet at a 90° angle to form one stream onto the substrate. The wafer is spun at 2500 rpm for 30 seconds after deposition The film is placed in a wafer carrier cartridge in the cleanroom ambient humidity that was set at 35%. The film is aged for 15 min. The film is then solvent exchanged by depositing 20–30 mL of an aged (36 hrs.) 50/50 (by vol.) mixture of acetone, and hexamethyldisilazane for 20 seconds at 250 rpm without allowing the film to dry. The film is then spun dry at 1000 rpm for 5 seconds. The film is heated at elevated temperatures for 1 min. each at 175° C. and 320° C. in air. The film is characterized by ellipsometry to determine the refractive index and thickness. In addition, the hydrophobicity is tested by placing a water drop onto the film to determine the contact angle.

As can be seen in the foregoing examples, the present invention enables one to produce a high quality, nanoporous silica film on the surface of a substrate.

What is claimed is:

1. A process for forming a nanoporous dielectric coating on a substrate which comprises:

A) performing either (i) or (ii):

i) a) combining a stream of an alkoxysilane composition with a stream of a base containing catalyst composition to form a combined composition stream which is unbounded at a point of confluence; and conducting steps (b) and (c) in either order or simultaneously:

b) immediately depositing the combined composition stream onto a surface of a substrate;

c) exposing the combined composition to water; and ii) a) combining a stream of an alkoxysilane composition with a stream of water to form a combined composition stream which is unbounded at a point of confluence; and b) immediately depositing the combined composition stream onto a surface of a substrate; and B) curing the combined composition to form said nanoporous coating.

2. The process of claim 1 wherein the alkoxysilane composition comprises at least one organic solvent.

3. The process of claim 1 wherein the alkoxysilane composition comprises at least one relatively high volatility organic solvent and at least one relatively low volatility organic solvent.

4. The process of claim 1 wherein the alkoxysilane composition comprises at least one organic solvent selected from the group consisting of methanol, ethanol, n-propanol, isopropanol, n-butanol, and alcohols and polyols including glycols such as ethylene glycol, 1,4-butylene glycol, 1,5-pentanediol, 1,2,4-butanetriol, 1,2,3-butanetriol, 2-methylpropanetriol, 2-(hydroxymethyl)-1,3-propanediol, 1,4,1,4-butanediol, 2-methyl-1,3-propanediol, tetraethylene glycol, triethylene glycol monomethyl ether, glycerol, and mixtures thereof.

5. The process of claim 1 wherein the alkoxysilane composition comprises at least one relatively high volatility organic solvent having a boiling point of about 120° C. or below and at least one relatively low volatility organic solvent having a boiling point of about 175° C. or above.

6. The process of claim 1 wherein the alkoxysilane composition comprises a component having the formula:

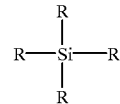

wherein at least 2 of the R groups are independently $C_1$ to $C_4$ alkoxy groups and the balance, if any, are independently selected from the group consisting of hydrogen, alkyl, phenyl, halogen, and substituted phenyl.

7. The process of claim 6 wherein each R is methoxy, ethoxy, propoxy or butoxy.

8. The process of claim 1 wherein the alkoxysilane composition comprises one or more components selected from the group consisting of tetraethoxysilane and tetramethoxysilane.

9. The process of claim 1 wherein the base containing catalyst composition comprises water, at least one organic solvent, or both water and at least one organic solvent.

10. The process of claim 9 wherein the base containing catalyst composition comprises at least one organic solvent component selected from the group consisting of methanol, ethanol, n-propanol, isopropanol, n-butanol, and alcohols and polyols including glycols such as ethylene glycol, 1,4-butylene glycol, 1,5-pentanediol, 1,2,4-butanetriol, 1,2, 3-butanetriol, 2-methyl-propanetriol, 2-(hydroxymethyl)-1, 3-propanediol, 1,4,1,4 -butanediol, 2-methyl-1,3-propanediol, tetraethylene glycol, triethylene glycol monomethyl ether, glycerol, and mixtures thereof.

11. The process of claim 1 wherein the base containing catalyst composition comprises ammonia, an amine or a mixture thereof.

12. The process of claim 11 wherein the base containing catalyst composition comprises at least one component selected from the group consisting of alcohol amines and alkylamines.

13. The process of claim 11 wherein the base containing catalyst composition comprises at least one component selected from the group consisting of methylamine, dimethylamine, trimethylamine, n-butylamine, n-propylamine, tetramethyl ammonium hydroxide, piperidine, 2-methoxyethylamine, mono-, di-, or triethanolamines, and mono-, di-, or triisopropanol amines.

14. The process of claim 1 wherein the substrate comprises at least one semiconductor material.

15. The process of claim 14 wherein the semiconductor material is selected from the group consisting of gallium arsenide, silicon, and compositions containing silicon such as crystalline silicon, polysilicon, amorphous silicon, epitaxial silicon, and silicon dioxide, and mixtures thereof.

16. The process of claim 1 wherein the substrate has a pattern of lines on its surface.

17. The process of claim 16 wherein the lines comprise a metal, an oxide, a nitride or an oxynitride.

18. The process of claim 16 wherein the lines comprise a material selected from the group consisting of silica, silicon nitride, titanium nitride, tantalum nitride, aluminum, aluminum alloys, copper, copper alloys, tantalum, tungsten and silicon oxynitride.

19. The process of claim 1 wherein the water is applied to the combined composition stream in the form of water vapor.

20. The process of claim 1 wherein the combining of the stream of alkoxysilane composition with the stream of a base containing catalyst composition is conducted in an atmosphere comprising water vapor.

21. The process of claim 1 wherein step i) c) is conducted by directing a stream comprising water into the combined composition prior to depositing the combined composition onto a surface of a substrate.

22. The process of claim 1 wherein the combined composition is cured by heating.

23. The process of claim 1 further comprising the subsequent step of treating the nanoporous dielectric coating with a surface modification agent under conditions sufficient to render the nanoporous dielectric coating hydrophobic.

24. The process of claim 23 wherein the surface modification agent comprises hexamethyldisilazane.

* * * * *